United States Patent
Iyechika et al.

[11] Patent Number: 5,980,632
[45] Date of Patent: Nov. 9, 1999

[54] MEMBER FOR USE IN PRODUCTION DEVICE FOR SEMICONDUCTORS

[75] Inventors: Yasushi Iyechika; Toshihisa Katamime, both of Tsukuba; Yoshinobu Ono, Tsukuba-gun; Tomoyuki Takada, Tsukuba, all of Japan

[73] Assignee: Sumitomo Chemical Company, Limited, Osaka, Japan

[21] Appl. No.: 09/219,115

[22] Filed: Dec. 23, 1998

Related U.S. Application Data

[62] Division of application No. 08/749,008, Nov. 14, 1996, abandoned.

[30] Foreign Application Priority Data

Nov. 14, 1995 [JP] Japan .................................... 7-295433

[51] Int. Cl.$^6$ .................................................. C30B 25/18
[52] U.S. Cl. .......................... 117/90; 117/94; 117/95; 117/106; 117/952; 117/953
[58] Field of Search .................................. 117/90, 94, 95, 117/106, 952, 953

[56] References Cited

U.S. PATENT DOCUMENTS

| | | | |
|---|---|---|---|
| 3,816,166 | 6/1974 | Eversteijn et al. | 117/106 A |
| 4,986,215 | 1/1991 | Yamada et al. | 118/725 |
| 5,121,531 | 6/1992 | Severns et al. | 29/25.01 |
| 5,406,575 | 4/1995 | Chelny et al. | 117/106 A |

FOREIGN PATENT DOCUMENTS

| | | |
|---|---|---|
| 63-0225591 | 9/1988 | Japan . |
| 1145400 | 6/1989 | Japan . |
| 5-175317 | 7/1993 | Japan . |
| 6-219835 | 8/1994 | Japan . |

*Primary Examiner*—Robert Kunemund
*Attorney, Agent, or Firm*—Birch, Stewart, Kolasch & Birch, LLP

[57] ABSTRACT

A process for producing a Group III—V compound semiconductor represented by the general formula $In_xGa_yAl_zN$ (provided that x+y+z=1, $0 \leq x \leq 1$, $0 \leq y \leq 1$, and $0 \leq z \leq 1$) employs a support member for forming the semiconductor, wherein the member constitutes SiC which is obtained by converting a graphite base material into SiC. In another embodiment, the member comprises a graphite-SiC composite wherein at least a surface layer part of a graphite substrate is converted into SiC. The member of the invention has superior chemical and mechanical stability, thereby making it useful in high-productivity production devices for making compound semiconductors.

10 Claims, 1 Drawing Sheet

MEMBER FOR USE IN PRODUCTION DEVICE FOR SEMICONDUCTORS

This application is a divisional of application Ser. No. 08/749,008, filed on Nov. 14, 1996, now abandoned the entire contents of which are hereby incorporated by reference.

BACKGROUND OF THE INVENTION

1. Field of the Invention

The present invention relates to a member for a production device for producing Group III—V compound semiconductors, and a production device using the same.

2. Description of Related Art

As a material of light-emitting devices such as a light-emitting diode (hereinafter sometimes referred to as "LED") in the ultraviolet, blue or green color range or a laser diode in the ultraviolet, blue or green color range, a Group III—V compound semiconductor represented by the general formula $In_xGa_yAl_zN$ (provided that $x+y+z=1$, $0 \leq x \leq 1$, $0 \leq y \leq 1$, and $0 \leq z \leq 1$) has hitherto been known.

Examples of processes for producing a Group III—V compound semiconductor include the molecular beam epitaxy (hereinafter sometimes referred to as "MBE") process, the organometallic vapor phase epitaxy (hereinafter sometimes referred to as "MOVPE") process, the hydride vapor phase epitaxy (hereinafter sometimes referred to as "HVPE") process and like processes. Among them, the MOVPE process is particularly preferred because uniform formation of layers in a large area can be generally conducted in comparison with the MBE and HVPE processes.

In the vapor phase deposition process for producing a compound semiconductor, a member of the production device is exposed to an atmosphere of raw gases (e.g. hydrogen, organometallic compounds, ammonia gas, etc.) which have a large reactivity at high temperature. Therefore, it is necessary that the members used in the production device be composed of a material which has high resistance to these raw gases and which emits a minimal amount of impurities so that a high-purity semiconductor can be grown.

Graphite is often used in a production device for semiconductors other than the compound semiconductor because of various features such as its stability at high temperature, its ability to be easily heated due to its high absorption efficiency of high frequency electromagnetic waves or infrared rays or by Joule heat of the current through the graphite itself, its emission of small amounts of impurities and the like. However, it is known that graphite has high reactivity to ammonia, especially at a high temperature, and is drastically deteriorated, upon exposure to a high-temperature ammonia atmosphere. Therefore, graphite is generally used after coating the surface of the graphite with a chemically stable material (e.g. SiC, etc.) in a thickness of about 100 μm.

However, problems occur in that the coating material such as SiC is gradually cracked or pinholes develop when it is exposed to a high-temperature (not less than 1000° C.) atmosphere for a long time or when a cycle of heating to a temperature of not less than 1000° C. and cooling to room temperature is repeated, even if graphite coated with SiC is used as the material for the member. Another problem is that the coated SiC cannot be used for the sliding part of the member because the surface thereof is not smooth.

On the other hand, a SiC-sintered member has high resistance to ammonia, but has a problem in that it cannot be easily formed into a complicated form because SiC is a remarkably hard material.

SUMMARY OF THE INVENTION

It is an object of the present invention to provide a member for a production device of a Group III—V compound semiconductor which is superior in chemical and mechanical stabilities, thereby providing a high-productivity production device which is suitable for producing a compound semiconductor.

In accordance with the present invention, it has been found that a member for a high-productivity production device of a Group III—V compound semiconductor can be obtained by using SiC obtained by subjecting a graphite base material to a specific treatment or a graphite-SiC composite wherein at least a surface layer part of the graphite base material is converted into SiC as the material.

In summary, the present invention relates to the following.

(1) In a member for a production device of a Group III—V compound semiconductor represented by the general formula $In_xGa_yAl_zN$ (provided that that $x+y+z=1$, $0 \leq x \leq 1$, $0 \leq y \leq 1$, and $0 \leq z \leq 1$), the improvement comprising using SiC wherein a graphite base material is converted into SiC.

(2) In a member for a production device of a Group III—V compound semiconductor represented by the general formula $In_xGa_yAl_zN$ (provided that that $x+y+z=1$, $0 \leq x \leq 1$, $0 \leq y \leq 1$, and $0 \leq z \leq 1$), the improvement comprising using a graphite-SiC composite wherein at least a surface layer part of a graphite base material is converted into SiC.

(3) A member for a production device of a Group III—V compound semiconductor according to (1) or (2), wherein the surface roughness of a contact part between the member for the production device of the Group III—V compound semiconductor of (1) or (2) and the other member is not more than 20 μm.

(4) A member for a production device of a Group III—V compound semiconductor according to (2), wherein the thickness of the layer converted into SiC is at least 500 μm from the surface.

(5) A production device of a Group III—V compound semiconductor which is characterized by using the member for the production device of the Group III—V compound semiconductor of (1), (2), (3) or (4).

DETAILED DESCRIPTION OF THE INVENTION

Figure 1:
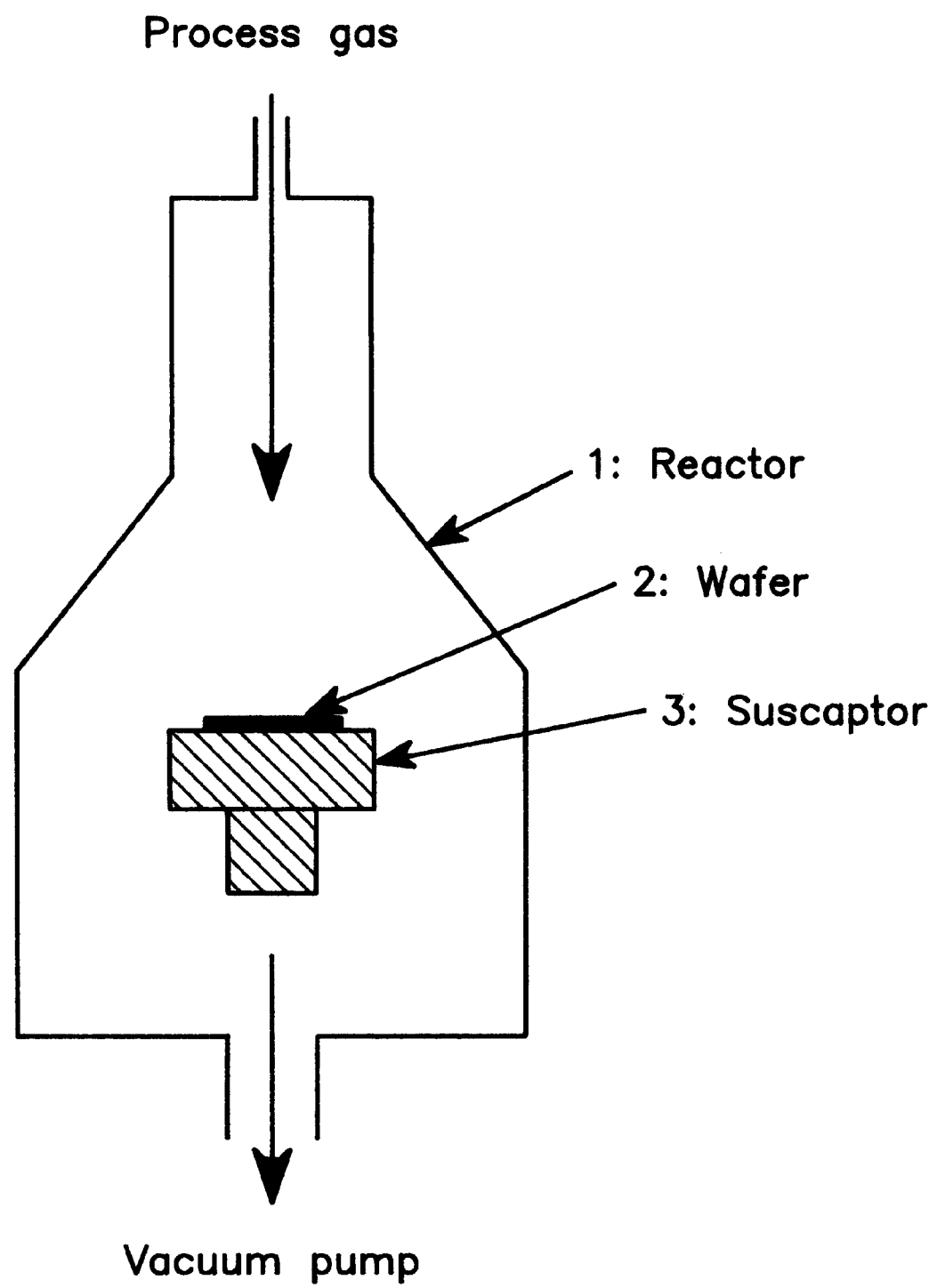
FIG. 1 is a schematic diagram illustrating a reactor used in Comparative Example 1 and Example 1.

The present invention will be described in detail hereinafter.

The member for a production device of the Group III—V compound semiconductor of the present invention is SiC obtained by converting a graphite base material into SiC or a graphite-SiC complex wherein at least a surface layer part of the graphite base material is converted into SiC. Graphite has good processability and can be processed in high accuracy and, therefore, a member having a complicated form of the present invention can be obtained by previously forming a graphite matrix into a suitable form.

The SiC layer is not easily peeled off in comparison with the case where the surface is coated with SiC, and processing such as polishing and the like can be conducted.

Particularly, when coating with SiC, cracks arise or SiC is peeled off by repeating a cycle of heating and cooling. Therefore, a process gas penetrates into the crack to cause deterioration such as erosion of the matrix and the like. However, the member of the present invention does not suffer such a problem by converting into SiC.

As the process of converting graphite into SiC, known techniques can be used. Specifically, there have ben known a process of reacting a graphite substrate with SiO gas for conversion into SiC (which is known as a CVR process, Japanese Patent Kokoku 61-11911, Japanese Patent Kokai (Laid-Open) No. 59-3084), a process of impregnating a graphite substrate with molten Si to convert it into SiC (Japanese Patent Kokai (Laid-Open) No. 1-242408), a process of coating the surface of a graphite base material with Si and then reacting the coated Si with graphite by a high-temperature treatment (Japanese Patent Kokai (Laid-Open) No. 1-249679), a process of firstly reacting a graphite substrate with SiO to convert it into SiC and then impregnating with molten Si for conversion into SiC (Japanese Patent Kokai (Laid-Open) No. 6-219835) and the like.

Since all of the materials produced by these processes show excellent chemical and mechanical stabilities, they can be suitably used as the material for the member of the present invention. In the process of impregnating graphite with molten Si, however, the degree of the surface converted into SiC is low and graphite is sometimes microscopically exposed. In the process of reacting graphite with SiO gas, it is difficult to convert the graphite into SiC to the inside of the base material. When some cracking arises by a mechanical shock, the graphite inside is sometimes exposed. In this respect, the graphite member can be uniformly converted into SiC to the inside according to the process of firstly reacting a graphite base material with SiO to convert it into SiC and then impregnating with molten Si to convert into SiC and, therefore, this process can be suitably used.

The thickness of the layer converted into SiC is preferably at least 500 μm from the surface of the graphite base material. A more preferred thickness of the layer converted into SiC is not less than 800 Am, most preferably not less than 1000 μm. When the thickness of the layer converted into SiC is smaller than 500 μm, adhesion between the layer converted into SiC and the graphite base material is not sufficient and the mechanical strength is sometimes not sufficient. In this respect, the graphite member can be uniformly converted into SiC to the inside according to the process of impregnating the material, wherein graphite or the surface layer part of the graphite is converted into SiC, with molten Si and, therefore, this process is particularly preferred.

Specific materials of the graphite-SiC composite, herein at least a surface layer part of the graphite base material is converted into SiC, include SOLSIX, SOLSIX-N, SOLSIX-G, SOLSIX-GA and the like (trade name, manufactured by Toyo Carbon Co., Ltd.). Among them, SOLSIX (trade name) is a material, wherein the surface layer part of graphite is converted into SiC to the inside by a CVR process and is further converted into SiC to the inside by impregnating with molten Si, and this material can be suitably used as the material for the member of the present invention.

When the member of the present invention is used as the sliding part of a gear, bearing and the like, or balls of a ball bearing, that is, when a contact part is present between the member and the other, the contact part is preferably used after surface polishing. The surface roughness (average unevenness) is preferably not more than 20 μm, more preferably not more than 10 μm, most preferably not more than 8 μm. When the surface roughness of the contact part is larger than 20 μm, the friction of the contact part is large and the member is sometimes damaged, which is disadvantageous.

The member of the present invention can be stable even in an atmosphere heated to about 1600° C.

The production device for the Group III—V compound semiconductor of the present invention is characterized by using the member of the present invention. Particularly, it is suitably used for a holding jig which is referred to as a "susceptor".

In the production of the semiconductors in high productivity, a vapor phase process technique capable of simultaneously treating a plurality of wafers and attaining high uniformity of the semiconductor in a wafer and between wafers is required. For this purpose, the wafer is generally placed on the holding jig which is referred to as the susceptor and the wafer performs a rotating or rotating/revolving motion due to an action of the susceptor. The rotating or rotating/revolving motion is performed so that good uniformity of the exposure of a process gas to a wafer is achieved in a wafer and between wafers. The term "rotating" means that the wafer rotates on its axis, the term "revolving" means that the susceptor, on which a plurality of substrates is placed, revolves on its axis, and the term "rotating/revolving" means that the rotation of the wafer and the revolution of the susceptor are simultaneously performed.

It is necessary to incorporate a mechanism (e.g. gear, etc.) for transmitting revolution to the susceptor so as to perform the rotating or rotating/revolving motion. When the susceptor is made by using the member of the present invention, the rotating or rotating/revolving motion can be smoothly performed by polishing the sliding part so that the surface roughness is adjusted within the above range.

The sliding properties can be further improved by incorporating mechanisms such as ball bearings, roller bearings, and the like into the sliding part. In this case, the balls and rollers of the bearings are preferably composed of the member of the present invention.

As the form of the rotating/revolving susceptor which can be used for the production device of a semiconductor of the present invention, those which are known for a normal vapor phase process can be used. Specific examples include those obtained by arranging a plurality of substrates on the plane, those obtained by placing a substrate on the side of an equilateral polygon pyramid (generally referred to as a "barrel type") and the like. The difference between the above two kinds of susceptors is as follows. That is, the rotating axis is generally parallel to the revolving axis in the former, while the rotating axis and revolving axis make a large angle in the latter. Actually, the angle between the rotating axis and revolving axis can be freely set within the range from about 0 degrees (the rotating axis is generally parallel to the revolving axis) to about 90 degrees.

When a high-temperature process is conducted by using the production process for making the semiconductors, the process gas sometimes cause a convection in the device. In this case, it becomes difficult to rapidly exchange or switch the process gases, or there sometimes arises a problem that a large amount of impurities is incorporated into the semiconductor. When such a problem arises, the convection is sometimes inhibited by feeding the process gas from the lower part, using a susceptor by which the surface of the wafer exposed to the process gas faces downward. Specific examples of the process for increasing the flow rate of the process gas include a process of increasing the feed of the process gas, a process which is conducted under reduced pressure (not more than 1 atm) and the like. In both cases, a high-productivity device can be made by using the member of the present invention.

EXAMPLES

The following Examples further illustrate the present invention in detail but are not to be construed to limit the scope thereof.

Comparative Example 1

GaN was grown using a production device of a GaN semiconductor shown in FIG. 1. As a material for the susceptor, those obtained by coating graphite with SiC in a thickness of 200 $\mu$m were used.

Firstly, a sapphire substrate was washed with an organic solvent and placed on a susceptor, and then the inside of the reactor chamber of the production device was substituted with a hydrogen atmosphere (1 atm). The susceptor was heated to 1110° C. and the inside of the chamber was etched with hydrogen chloride gas for 5 minutes. Then, the temperature of the susceptor was reduced to 550° C. and ammonia, hydrogen and trimethylgallium [$(CH_3)_3Ga$, hereinafter sometimes referred to as "TMG"] were respectively fed in an amount of 4 SLM, 4 SLM and 0.15 SCCM to form a GaN buffer layer (300 angstroms). Then, the temperature of the susceptor was raised to 1100° C. and ammonia, hydrogen and TMG were respectively fed in an amount of 4 SLM, 4 SLM and 1 SCCM to grow GaN for 30 minutes. The resultant GaN had a mirror surface and the film thickness thereof was about 2.5 $\mu$m.

"SLM" and "SCCM" are units of gas flow. "1 SLM" means that gas occupying 1 liter of volume in the normal state flows per minute, and "1000 SCCM" corresponds to "1 SLM".

The growth of GaN described above was repeated 20 times. As a result, it was confirmed that cracks arose at the SiC part of the side surface of the susceptor. Graphite inside was corroded at the periphery of the cracks. Also confirmed was peeling off of the coated SiC film at the bottom of the susceptor.

Example 1

A plate of a graphite-SiC composite having a thickness of 2 mm (trade name: SOLSIX, manufactured by Toyo Carbon Co., Ltd.) was further placed on the susceptor of Comparative Example 1 and the growth was conducted according to the same manner as that described in Comparative Example 1. Regarding the plate which is composed of the graphite-SiC composite, the part which is 0.5 mm away from the surface is exclusively composed of SiC. Regarding the inside part, 37% thereof is composed of SiC and the remainder is composed of graphite Even if the growth was repeated 20 times, any change such as cracks, peeling, corrosion, and the like was not observed in the plate of the graphite-SiC composite. In any growth in this Example, the resultant GaN film had a mirror surface.

Example 2

Using SOLSIX (trade name, manufactured by Toyo Carbon Co., Ltd.) a rotating/revolving susceptor capable of simultaneously treating a plurality of 2 inch wafers was made. The sliding part was polished so that the surface roughness became not more than 8 $\mu$m. This susceptor was placed in an atmosphere wherein the respective partial pressures of ammonia, hydrogen and TMG are the same as those of Comparative Example 1 at 1100° C. and rotation/revolution was conducted. As a result, a smooth rotating/revolving motion of the substrate was confirmed.

After the substrate, susceptor and reactor were etched by adding hydrogen chloride to hydrogen as a carrier gas at 1100° C. under a growing pressure of 0.1 atm, GaN (300 angstroms) as a buffer layer was grown at 550° C. and GaN (3 $\mu$m) was grown at 1050° C., using ammonia, TMG and hydrogen as the carrier gas. As a result, an excellent crystal growth having excellent surface properties could be conducted. A rocking curve was measured by X-rays. As a result, it has been found that the resultant crystal has excellent crystallizability, i.e., its half-width is about 5 minutes.

The above growth was repeated 50 times, but the resultant crystals of the GaN film had good characteristics similar to the above case, and deterioration such as cracks, peeling and the like was not observed in the susceptor. The rotation/resolution of the substrate was smooth.

Example 3

Using SOLSIX (trade name, manufactured by Toyo Carbon Co., Ltd.), a susceptor which has the same shape as the susceptor used in Comparative Example 1, was made. Using this susceptor, GaN was grown by a process which is almost the same as the process of Comparative Example 1. On this GaN crystal, an InGaN layer whose InN mixed crystal ratio was about 30%, and a GaAlN layer whose AlN mixed crystal ratio was about 20%, were further grown, so as to make a so-called quantum well structure. Materials used for the growth of the quantum well structure were trimethylindium, triethylgallium, triethylaluminum, ammonia, and Ar as In, Ga, Al, N sources and a carrier gas, respectively. The layers grown on the GaN crystal were 50 and 300 angstroms thick, respectively. From this quantum well structure, a photoluminescence spectrum was measured and a prominent blue emission was observed, from which it was confirmed that the quantum well structure was of high quality.

Example 4

Using the same susceptor as in Example 3, more than 100 times growths of undoped, n- and p-type GaN, quantum well structures on the GaN, and light emitting devices of lamination of a quantum well structure and a p-type charge injection layer on the n-type GaN, were performed, and no peeling off and cracks of the surface layer of the susceptor were found. Among the crystals obtained in this way, there was no deterioration of crystallinity thought to be caused by deterioration of the susceptor.

By using the member of the present invention for a vapor phase deposition device for providing a Group III—V compound semiconductor, which is exposed to an atmosphere having high reactivity at high temperature, a deposition device having excellent productivity, capable of growing a high-quality compound semiconductor crystal, can be made. Therefore, the present invention is extremely useful and has a large industrial value.

What is claimed is:

1. A process for producing a Group III—V compound semiconductor represented by the general formula $In_xGa_yAl_zN$ wherein $x+y+z=1$, $0 \leq x \leq 1$, $0 \leq y \leq 1$, and $0 \leq z \leq 1$, which comprises forming the semiconductor on a support member having a SiC layer which is obtained by converting a graphite base material into SiC, wherein the thickness of the layer converted into SiC is at least 500 μm.

2. A process for producing a Group III—V compound semiconductor represented by the general formula $In_xGa_yAl_zN$ wherein x+y+z=1, $0 \leq x \leq 1$, $0 \leq y \leq 1$, and $0 \leq z \leq 1$, which comprises forming the semiconductor on a support member having a layer of a graphite-SiC composite which is obtained by converting at least a surface layer part of a graphite base material into SiC, wherein the thickness of the layer converted into SiC is at least 500 μm.

3. The process according to claim 1, wherein the surface roughness of said member is not more than 20 μm.

4. The process according to claim 2, wherein the surface roughness of said member is not more than 20 μm.

5. The process according to claim 1, wherein the thickness of the layer converted into SiC is not less than 800 μm.

6. The process according to claim 2, wherein the thickness of the layer converted into SiC is not less than 800 μm.

7. The process according to claim 1, wherein the thickness of the layer converted into SiC is not less than 1000 μm.

8. The process according to claim 2, wherein the thickness of the layer converted into SiC is not less than 1000 μm.

9. The process according to claim 1, wherein said member is a support for a semiconductor substrate which is exposed to conditions for producing the compound semiconductor.

10. The process according to claim 2, wherein said member is a support for a semiconductor substrate which is exposed to conditions for producing the compound semiconductor.

* * * * *

UNITED STATES PATENT AND TRADEMARK OFFICE
CERTIFICATE OF CORRECTION

PATENT NO. : 5,980,632
DATED : November 9, 1999
INVENTOR(S) : Iyechika et al.

It is certified that error appears in the above-identified patent and that said Letters Patent is hereby corrected as shown below:

Column 6, line 21-22, change "rotation/resolution" to --rotation/revolution--.

Signed and Sealed this

Tenth Day of October, 2000

*Attest:*

Q. TODD DICKINSON

*Attesting Officer*    *Director of Patents and Trademarks*